United States Patent
Braun et al.

(10) Patent No.: US 7,440,349 B2
(45) Date of Patent: Oct. 21, 2008

(54) INTEGRATED SEMICONDUCTOR MEMORY WITH DETERMINATION OF A CHIP TEMPERATURE

(75) Inventors: Georg Braun, Holzkirchen (DE); Aaron Nygren, München (DE)

(73) Assignee: Qimonda AG, Munich (DE)

( * ) Notice: Subject to any disclaimer, the term of this patent is extended or adjusted under 35 U.S.C. 154(b) by 6 days.

(21) Appl. No.: 11/635,088

(22) Filed: Dec. 7, 2006

(65) Prior Publication Data

US 2007/0133329 A1 Jun. 14, 2007

(30) Foreign Application Priority Data

Dec. 7, 2005 (DE) ................. 10 2005 058 438

(51) Int. Cl.
*G11C 7/04* (2006.01)
*G11C 5/00* (2006.01)
*G11C 7/00* (2006.01)
*G11C 17/18* (2006.01)

(52) U.S. Cl. .................... 365/211; 365/52; 365/189.07; 365/189.12; 365/225.7

(58) Field of Classification Search .................. 365/51, 365/52, 189.01, 189.07, 189.12, 211, 212, 365/225.7, 240

See application file for complete search history.

(56) References Cited

U.S. PATENT DOCUMENTS

| | | | |
|---|---|---|---|
| 6,778,453 B2 * | 8/2004 | Cooper et al. ............... | 365/211 |
| 6,809,914 B2 | 10/2004 | Edmonds et al. | |
| 6,836,704 B2 * | 12/2004 | Walsh ........................ | 365/211 |
| 6,934,173 B2 * | 8/2005 | Keeth et al. .................... | 365/51 |
| 6,940,775 B2 * | 9/2005 | Schneider et al. ........... | 365/211 |
| 7,313,044 B2 * | 12/2007 | Fuhrmann et al. ........... | 365/211 |
| 2001/0014049 A1 | 8/2001 | Woo et al. | |
| 2006/0120139 A1 * | 6/2006 | Perner et al. | |

* cited by examiner

*Primary Examiner*—Trong Phan
(74) *Attorney, Agent, or Firm*—Edell, Shapiro & Finnan, LLC

(57) ABSTRACT

An integrated semiconductor memory capable of determining a chip temperature includes first control terminals for driving the integrated semiconductor memory with first control signals for performing a write access and second control terminals provided for performing a read access. The integrated semiconductor further includes a control circuit for controlling a write and read access. A temperature sensor for recording a chip temperature of the integrated semiconductor memory is connected to the control circuit. The control circuit is configured to generate a state of a third control signal at one of the first or at one of the second control terminals in a manner dependent on a temperature recorded by the temperature sensor.

17 Claims, 3 Drawing Sheets

INTEGRATED SEMICONDUCTOR MEMORY WITH DETERMINATION OF A CHIP TEMPERATURE

CROSS REFERENCE TO RELATED APPLICATIONS

This application claims priority under 35 U.S.C. §119 to Application No. DE 102005058438.1 filed on Dec. 7, 2005, entitled "Integrated Semiconductor Memory with Determination of a Chip Temperature," the entire contents of which are hereby incorporated by reference.

BACKGROUND

One of the possible causes of faults when operating an integrated semiconductor memory, for example a DRAM (Dynamic Random Access Memory) semiconductor memory, is the exceeding of a threshold value of a chip temperature of the integrated semiconductor memory. As a result of the increased chip temperature, malfunctions occur in the event of read and write accesses to the memory cells of the integrated semiconductor memory.

The chip temperature of a semiconductor memory is dependent on the number of read and write accesses taking place per unit time, or a clock frequency with which the integrated semiconductor memory is operated. Further factors which directly influence the chip temperature are the magnitude of the supply voltage at which a semiconductor memory is operated, and also the current intensities that occur on the memory chip. Furthermore, the bit pattern to be stored in a memory cell array of a semiconductor memory also affects the chip temperature. A heating of a memory chip may also stem from the emission of heat from other devices, in particular further semiconductor memories, situated in the vicinity of a semiconductor memory.

In order to avoid faulty memory accesses to integrated semiconductor memories, it is therefore absolutely necessary to monitor the chip temperature within a housing of the integrated semiconductor memory. Semiconductor memories are therefore generally provided with temperature sensors for recording the current chip temperature. In the event of a threshold value of the chip temperature of a semiconductor memory being exceeded, a control signal is output to a control component connected to the relevant semiconductor memory, the control signal indicating the excessive heating of the semiconductor memory to the control component. If the control component detects such a warning signal, by way of example, it reduces the number of read and write accesses to a semiconductor memory module on which the heated semiconductor memory is arranged, until the chip temperature has cooled down again.

In the case of a semiconductor memory module, generally a plurality of integrated semiconductor memories is arranged on a module circuit board. For controlling read and write accesses to the individual integrated semiconductor memories, the module is connected to a centrally arranged control component. Each integrated semiconductor memory has a control terminal specially provided for it, at which, in the event of a permissible chip temperature of the semiconductor memory being exceeded, a corresponding control signal indicating the increased heating of the semiconductor memory is output. The control terminals of the integrated semiconductor memories that are provided for generating the control signal are connected to the control component via a common line. The control component detects the occurrence of a control signal only on the common line and thereupon reduces the number of memory accesses to all the memory chips of the semiconductor memory module. Since the control terminals of the semiconductor memories of a module at which the respective control signals for warning about the increased chip temperature are generated are connected to the control component via a common line, the control component cannot ascertain which of the semiconductor memories is in a critical temperature state. The measures initiated by the control component for lowering the temperature, for example the reduction of the memory accesses per unit time to the integrated semiconductor memory, thus jointly affect all the semiconductor memories of the semiconductor memory module. In this respect, the access rate is also reduced to those semiconductor memories which have a non-critical chip temperature.

In order to be able to detect which of the semiconductor components on a memory module has an increased chip temperature, at the present time the control terminal of each semiconductor memory of the memory module which is provided for generating the control signal indicating the increased chip temperature is connected to the control component via a conductor track specially provided for the semiconductor memory component. As a result, the control component can ascertain in a targeted manner which of the semiconductor memories that it supervises has an increased chip temperature. In the event of a threshold value of the chip temperature being exceeded, only the memory accesses to the affected semiconductor memory are then reduced.

According to the specified methods specific control terminals at which the control signal indicating the increased chip temperature is generated have to be provided. Furthermore, the space requirement on the memory module increases if a specific conductor track via which the temperature warning signal is transmitted to the control component has to be provided for each semiconductor memory.

SUMMARY

The invention relates to an integrated semiconductor memory in which a chip temperature is determined. The invention furthermore relates to a method for operating an integrated semiconductor memory in which a chip temperature is determined.

One embodiment of the invention relates to an integrated semiconductor memory in which the transmission of a control signal indicating the overshooting (exceeding) of a threshold value of a chip temperature to a control component that controls memory accesses to the integrated semiconductor memory is improved. According to another embodiment of the present invention, a semiconductor memory module comprises an integrated semiconductor memory in which the transmission of a control signal indicating the overshooting of a threshold value of a chip temperature to a control component of the semiconductor memory module that controls memory accesses to the integrated semiconductor memory is improved. A further embodiment of the invention relates to a method for operating an integrated semiconductor memory in which the transmission of a control signal indicating the overshooting of a threshold value of a chip temperature to a control component that controls memory accesses to the integrated semiconductor memory is improved.

An integrated semiconductor memory that determines a chip temperature comprises a memory cell array comprising memory cells, first control terminals for driving the integrated semiconductor memory with first control signals for performing a write access to the memory cells of the memory cell array, and second control terminals for driving the integrated semiconductor memory with second control signals for performing a read access to the memory cells of the memory cell array. The integrated semiconductor memory furthermore comprises a control circuit connected to the first and second control terminals, the control circuit controlling a write access in a manner dependent on the first control signals and a read access to the memory cells of the memory cell array in a manner dependent on the second control signals. Furthermore, a temperature sensor is provided for recording a chip temperature of the integrated semiconductor memory, the temperature sensor being connected to the control circuit. The control circuit is configured to generate a state of a third control signal at one of the first or at one of the second control terminals in a manner dependent on a temperature recorded by the temperature sensor.

According to an embodiment of to the semiconductor memory module the semiconductor memory module comprises an integrated semiconductor memory according to one of the embodiments specified and comprising a control unit for driving the integrated semiconductor memory with the first and second control signals for performing a read or write access to the memory cells of the integrated semiconductor memory. The control unit has a bidirectional control terminal for generating one of the first or second control signals and for receiving the third control signal. The bidirectional control terminal is connected to the one of the first or second control terminals of the integrated semiconductor memory. The control unit is configured to control the read and write accesses, taking place during a unit of time, to the memory cells of the integrated semiconductor memory in a manner dependent on the state, received at the bidirectional control terminal, of the third control signal that has been generated by the integrated semiconductor memory.

An embodiment of a method for operating an integrated semiconductor memory provides an integrated semiconductor memory comprising memory cells for storing data comprising first control terminals for driving the integrated semiconductor memory with first control signals for performing a write access to the memory cells of the integrated semiconductor memory, and comprising second control terminals for driving the integrated semiconductor memory with second control signals for performing a read access to the memory cells of the integrated semiconductor memory. The method involves determining a chip temperature of the integrated semiconductor memory. The determined chip temperature of the integrated semiconductor memory is compared with a threshold value of the chip temperature. A read access to memory cells of the integrated semiconductor memory is performed. A state of a third control signal is generated in a manner dependent on the comparison of the determined chip temperature of the integrated semiconductor memory with the threshold value of the chip temperature at one of the first control terminals during the read access to the memory cells of the integrated semiconductor memory. The state of the third control signal is detected at one of the first control terminals by a control unit. The read and write accesses, taking place during a unit of time, to the memory cells of the integrated semiconductor memory are reduced if the control unit ascertains that at the one of the first control terminals the third control signal is generated with a state that identifies a chip temperature above the threshold value.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to figures showing exemplary embodiments of the present invention.

DETAILED DESCRIPTION

Figure 1:
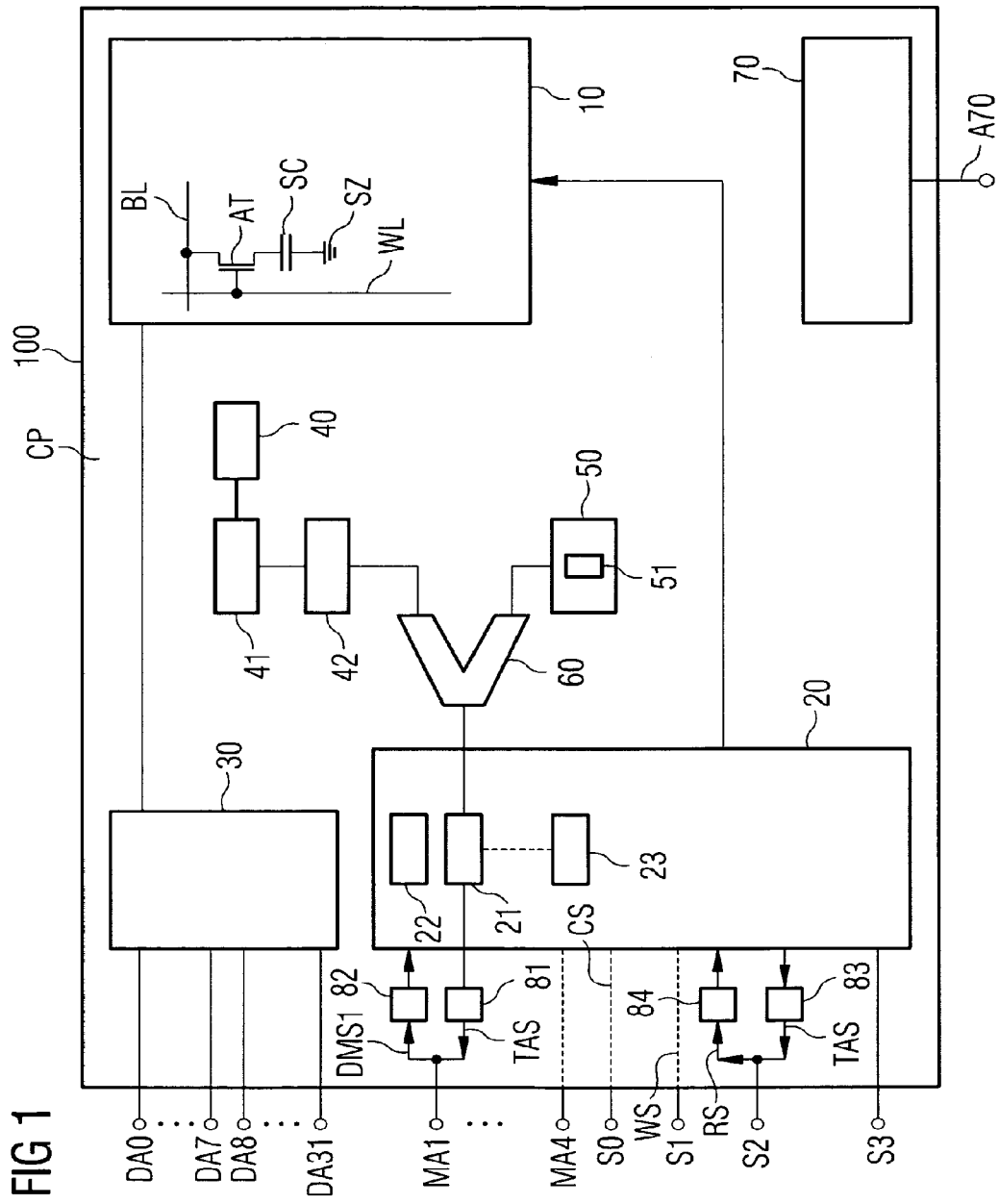
FIG. 1 shows an embodiment of an integrated semiconductor memory in which a control signal is generated in the event of a threshold value of the chip temperature being exceeded.

In accordance with one development of the integrated semiconductor memory, the control circuit is formed such that, during a read access, the control circuit generates the third control signal at one of the first control terminals in a manner dependent on the chip temperature recorded by the temperature sensor.

According to a further feature of the integrated semiconductor memory, the memory has a driver circuit connected to the one of the first control terminals and to the control circuit. The driver circuit is driven by the control circuit such that, during the read access, the control circuit generates the third control signal at the one of the first control terminals.

In accordance with another embodiment, the control circuit is configured such that, during a write access, the control circuit generates the third control signal at the one of the second control terminals in a manner dependent on the temperature recorded by the temperature sensor.

In this embodiment, the integrated semiconductor memory has a further driver circuit connected to the one of the second control terminals and to the control circuit. The further driver circuit is driven by the control circuit such that during the write access, the control circuit generates the third control signal at one of the second control terminals.

According to a further feature of the integrated semiconductor memory, the latter has a plurality of data terminals for applying data. The control circuit comprises an evaluation circuit for evaluating one of the first control signals present at the one of the first control terminals. The control circuit is configured such that, in the event of a write access to the integrated semiconductor memory, the control circuit writes a datum present at one of the data terminals to one of the memory cells of the memory cell array if the evaluation circuit determines that the one of the first control signals is present with a first state at the one of the first control terminals. The control circuit is furthermore configured such that, in the event of a write access to the integrated semiconductor memory, the control circuit ignores the datum present at the one of the data terminals for writing to the one of the memory cells of the memory cell array if the evaluation circuit determines that the one of the first control signals is present with a second state at the one of the first data terminals.

In one development of the integrated semiconductor memory, one of the first control terminals is a terminal for masking the one of the data terminals.

In accordance with one development of the semiconductor memory module, the memory module has a further integrated semiconductor memory according to one of the embodiments mentioned above. The control unit has a further bidirectional control terminal for generating a further one of the first or second control signals and for receiving the third control signal. The further bidirectional control terminal is connected to the one of the first or second control terminals of the further integrated semiconductor memory. The control unit is configured to control the read and write accesses, occurring during the unit of time, to the memory cells of the further integrated semiconductor memory in a manner dependent on the state of the third control signal that is received at the further bidirectional control terminal and has been generated by the further integrated semiconductor memory. The bidirectional control terminal is connected to a further one of the first or second control terminals of the further integrated semiconductor memory. The further bidirectional control terminal is connected to the further one of the first or second control terminals of the integrated semiconductor memory.

In accordance with one development of the method, an integrated semiconductor memory comprising a plurality of data terminals is provided. The first control terminals are driven with the first control signals for performing a write access, there being applied to one of the first control terminals one of the first control signals with a state, whereby at least one of the data terminals is masked for the write access. Data is applied to the data terminals for writing the data to the memory cells. A read access to the memory cells is subsequently performed, the state of the third control signal being generated at the one of the first control terminals.

A further configurational form of the method for operating an integrated semiconductor memory provides an integrated semiconductor memory comprising memory cells for storing data comprising first control terminals for driving the integrated semiconductor memory with first control signals for performing a write access to the memory cells of the integrated semiconductor memory, and comprising second control terminals for driving the integrated semiconductor memory with second control signals for performing a read access to the memory cells of the integrated semiconductor memory. A chip temperature of the integrated semiconductor memory is determined. The determined chip temperature of the integrated semiconductor memory is compared with a threshold value of the chip temperature. A write access to the memory cells of the integrated semiconductor memory is performed. A state of a third control signal is generated in a manner dependent on the comparison of the determined chip temperature of the integrated semiconductor memory with the threshold value of the chip temperature at one of the second control terminals during the write access to the memory cells of the integrated semiconductor memory. The state of the third control signal is detected at the one of the second control terminals by the control unit. The read and write accesses, occurring during a unit of time, to the memory cells of the integrated semiconductor memory are altered in a manner dependent on the state of the third control signal.

FIG. 1 shows an integrated semiconductor memory 100, in which a control signal is generated at a control terminal of the integrated semiconductor memory in the event of a threshold value of a chip temperature being exceeded. Situated on a memory chip CP of the integrated semiconductor memory is a memory cell array 10, in which memory cells SZ are arranged in matrix-like fashion along word lines WL and bit lines BL. In the case of a DRAM memory cell, the memory cell SZ comprises a storage capacitor SC connected to a bit line BL via a selection transistor AT. The control of read and write accesses to the memory cells SZ of the memory cell array 10 is performed by a control circuit 20. The control circuit 20 is connected to various external control terminals MA1, . . . , MA4, S0, . . . , S3 for driving with external control signals.

In the case of a read access to the integrated semiconductor memory, the semiconductor memory is selected by the driving of the control terminal S0 with a chip select signal CS for the subsequent memory access. A read signal RS is applied to the control terminal S2. For the selection of one of the memory cells SZ of the memory cell array 10 for the read access to be performed, an address of that memory cell which is intended to be selected for the subsequent read access is applied to a control terminal A70 of an address register 70. The control circuit 20 thereupon drives the word line WL connected to the memory cell SZ to be read with a high control voltage potential, so that the selection transistor AT of the selected memory cell is controlled into the on state and the storage capacitor SC is thus connected with low impedance to the bit line BL. The datum read out from the memory cell SZ is fed to a driver circuit 30 and output at one of the data terminals DA0, . . . , DA31.

In the case of a write access to the integrated semiconductor memory 100, the control terminal S0 is driven by the chip select signal CS. For performing the write access to a memory cell of the memory cell array 10, the control terminal S1 is driven by a write signal WS. A memory cell to which a datum applied at one of the data terminals DA0, . . . , DA31 is intended to be written is selected via an address signal applied to the address terminal A70 of the address register 70. For performing the write access, the control circuit 20 drives the word line WL connected to the selected memory cell with a high control voltage potential, so that the selection transistor AT of the memory cell is controlled into the on state. By the driver circuit 30, a datum present at one of the data terminals is amplified and written to the activated memory cell SZ via the bit line BL.

The control signals CS for the selection of the integrated semiconductor memory for a memory access, WS for performing a write access and RS for performing a read access and also the data which are applied to the data terminals DA0, . . . , DA31 in the case of a write access are provided by a control component, for example a memory controller. In the example of the semiconductor memory illustrated in FIG. 1, generally all the data terminals DA0, . . . , DA31 are driven with corresponding data signals in the case of a write access to the integrated semiconductor memory.

However, there is also the possibility that not all of these data which are transmitted to the data terminals DA0, . . . , DA31 by the control component are written to the memory cells of the integrated semiconductor memory 100. For this purpose, individual data terminals are masked by the control component. If a data terminal is masked, the datum present at it is not stored in the memory cells of the memory cell array 10. The control terminals MA1, . . . , MA4 are provided for the masking of data terminals. The four control terminals MA1, . . . , MA4 are shared between 32 data terminals DA0, . . . , DA31 in the example of FIG. 1.

If, by way of example, the data terminals DA0, . . . , DA7 are intended to be masked in the event of a write access to the integrated semiconductor memory, the control terminal MA1 is driven by a control signal DMS1. The control signal DMS1 is detected by a receiver circuit 82 and forwarded to the control circuit 20. The control signals which are present at the control terminals MA1, . . . , MA4 are evaluated by an evaluation circuit 22. If the evaluation circuit 22 determines that a specific state of the control signal DMS1 occurs at the control terminal MA1, then the data present at the data terminals DA0, ..., DA7 are not written to the memory cell array 10 of the integrated semiconductor memory in the event of the subsequent write access. The remaining control terminals MA2, ..., MA4 serve for masking eight further data terminals each, among terminals DA8, ..., DA31.

For determining a chip temperature of the integrated semiconductor memory 100, a temperature sensor 40 is situated on the memory chip CP. The temperature sensor 40 is connected to a multiplexer 60 via an analog-to-digital converter 41 and a conversion circuit 42. The multiplexer 60 is furthermore connected to a programming circuit 50 comprising a programmable element 51. The programmable element 51 is a fuse element, for example, which is programmed during the production of the integrated semiconductor memory. An output of the multiplexer 60 is connected to a comparator circuit 21 of the control circuit 20.

The temperature sensor 40 detects the chip temperature of the memory chip CP and forwards an analog output signal, which identifies the current chip temperature, to the analog-to-digital converter 41. The analog output signal of the temperature sensor 40 is converted into a digital value by the analog-to-digital converter 41 and fed to the conversion circuit 42. The conversion circuit 42 generates on the output side a signal that can be evaluated by the comparator circuit 21. A signal identifying the current chip temperature is thus fed from the conversion circuit 42 to the comparator circuit 21 via the multiplexer 60. A signal identifying the threshold value of the chip temperature is fed from the programming circuit 50 to the comparator circuit 21 via the multiplexer 60. The comparator circuit 21 thus compares the current chip temperature that has been detected by the temperature sensor 40 with a threshold value of the chip temperature that has been programmed in the programming circuit 50.

According to another option, it is possible to provide a storage register 23, in which the threshold value of the chip temperature can be stored. In this case, the threshold value can be stored reversibly (i.e., can be programmable) by application of a configuration signal KS with a corresponding state to a control terminal S4. By way of example, the mode register of a semiconductor memory can be used as a storage register.

If the chip temperature detected by the temperature sensor 40 lies above the threshold value of the chip temperature, the comparator circuit 21 drives a driver circuit 81, which thereupon generates a first state of a control signal TAS. The first state of the control signal TAS thus corresponds to a warning signal indicating that the chip temperature of the semiconductor memory 100 lies above a critical threshold value. The control signal TAS is subsequently fed to the control terminal MA1. Erroneous read and write accesses must be expected in the event of the critical chip temperature being exceeded. A control component that detects the first state of the control signal TAS will thereupon reduce the number of memory accesses taking place per unit time, by way of example, in the case of the affected semiconductor memory.

If the detected chip temperature lies below the threshold value, the comparator circuit 21 drives the driver circuit 81 such that the driver circuit generates a second state of the control signal TAS, which is fed to the control terminal MA1. After evaluation of the second state of the control signal TAS, the control component connected to the control terminal MA1 recognizes that the semiconductor memory transmitting the second state of the control signal TAS is in the specified temperature range or, after prior overshooting of the permissible chip temperature, is in the specified temperature range again. The number of memory accesses per unit time can be increased again in the latter case.

According to an embodiment of the invention, the control signal TAS is output at a control terminal which is otherwise used only during a write access. In the example of FIG. 1, the control terminal MA1 corresponds to a control terminal which is otherwise used exclusively during a write access for masking data terminals. The control signal TAS can therefore be output at the control terminal MA1 during a read access to the integrated semiconductor memory 100 since this control terminal is not normally used by a control component during a read access.

It is likewise possible for the control signal TAS also to be output at a control terminal which is otherwise used only during a read access. Thus, during a write access, the control signal TAS can for example also be forwarded from the control circuit 20 to a driver circuit 83, via which the control signal TAS is then output at the control terminal S2 that is actually provided for driving the integrated semiconductor memory with the read signal RS.

The control terminals MA1, ..., MA4 have heretofore been provided only for receiving the control signals DMS for masking data terminals. Therefore, receiving circuits 82 are connected to the control terminals MA1, ..., MA4. A receiving circuit 84 is likewise connected to the control terminal S2, the receiving circuit receiving the read command RS and forwarding it to the control circuit 20. In the case of integrated semiconductor memories, however, generally not only receiving circuits but also so-called dummy driver circuits are connected to the control terminals, in particular also to those control terminals which have hitherto been provided only for receiving control signals of the control component. The driver circuits, the driver circuits 81 and 83 in the example of FIG. 1, have hitherto not had a driver function, but rather have been provided only for load matching. The provision of dummy driver circuits at the control terminals of the semiconductor memory means that the control terminals behave load-symmetrically with respect to the data terminals which are likewise connected, for receiving data, in each case to receiving circuits 31 and driver circuits 32.

One embodiment the invention makes use of the presence of the dummy driver circuits for generating the control signal TAS. The control signal TAS can therefore be generated at the control terminal MA1, for example, by the driver circuit 81 in the case of a read access, or it can be generated at the control terminal S2 by the dummy driver circuit 83 in the event of a write access.

Figure 2:
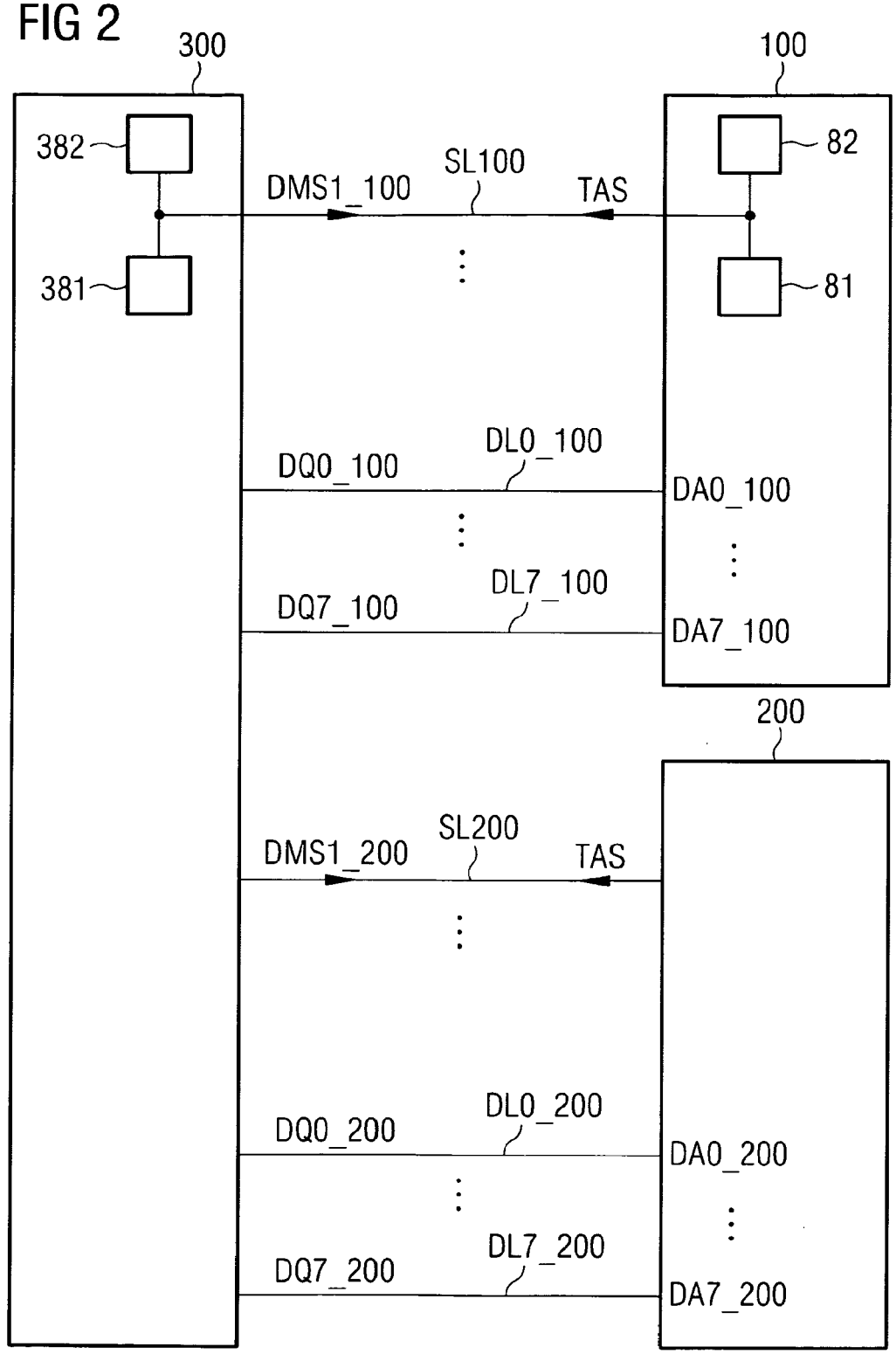
FIG. 2 shows a first embodiment of a memory module comprising integrated semiconductor memories in each of which a control signal is generated in the event of a threshold value of a chip temperature being exceeded.

FIG. 2 shows a memory module in which a semiconductor memory 100 and a semiconductor memory 200 are driven with control and data signals by a control component 300, for example a memory controller. For the sake of simplicity, only conductor tracks SL for transmitting the control signals DMS for masking data terminals DA0, ..., DA31 and conductor tracks DL for transmitting the data signals DQ are illustrated between the semiconductor memories 100 and 200. Each of the conductor tracks is connected to a driver circuit 381 and a receiving circuit 382 in the control component 300. In the region of the semiconductor memories, the lines are terminated by a driver circuit 81 and a receiving circuit 82. For reasons of better clarity, the driver and receiving circuits are illustrated only at the conductor track SL100 for transmitting the masking control signal DMS1_100. In the case of the control component 300, the receiving circuit 382 has previously been used only for load matching or for producing a symmetrical line termination. Correspondingly, on the part of the semiconductor memories, the driver circuit 81 has previously been used only for load matching or for producing a symmetrical line termination. According to the invention, the driver circuit 81 is now used for generating the control signal TAS and the receiving circuit 382 is now used for receiving the control signal TAS.

For the sake of simplicity, only the conductor tracks SL100 for transmitting the masking signal DMS1_100 for masking the data terminals DA0_100, . . . , DA7_100 and for transmitting the control signal TAS and also the data lines DL1_100 for transmitting a datum DQ0_100 and the data line DL7_100 for transmitting the data signal DQ7_100 are illustrated between the semiconductor memory 100 and the control component 300. Correspondingly, only the conductor tracks SL200 for transmitting the masking signal DMS1_200 for masking the data terminals DA0_200, . . . , DA7_200 and for transmitting the control signal TAS and also the data line DL1_200 for transmitting a datum DQ0_200 and the data line DL7_200 for transmitting the data signal DQ7_200 are illustrated between the semiconductor memory 200 and the control component 300.

According to another embodiment of the invention, each of the semiconductor memories 100 and 200 is connected via a dedicated conductor track SL100 and SL200, respectively, for transmitting the control signal TAS. In contrast to previous embodiments in which conductor tracks which were provided exclusively for transmitting the control signal TAS were used between the semiconductor memories and the control component, already existing lines such as the conductor tracks SL100 and SL200, respectively, for transmitting the control signals DMS1_100 and DMS1_200, respectively, for masking data terminals are used for transmitting the control signal TAS according to the invention. Of course, the control signals TAS can be transmitted only when the conductor tracks SL100 and SL200, respectively, are not being used for some other purpose. This is the case in the event of a read access to the semiconductor memories 100 and 200 in the example of FIG. 2. In the event of a read access to the semiconductor memories 100 and 200, the conductor tracks SL100 and SL200, respectively, are used for transmitting the control signal TAS, whereas in the event of a write access they are used for transmitting the control signals DMS1_100 and DMS2_200, respectively, for masking data terminals.

Figure 3:
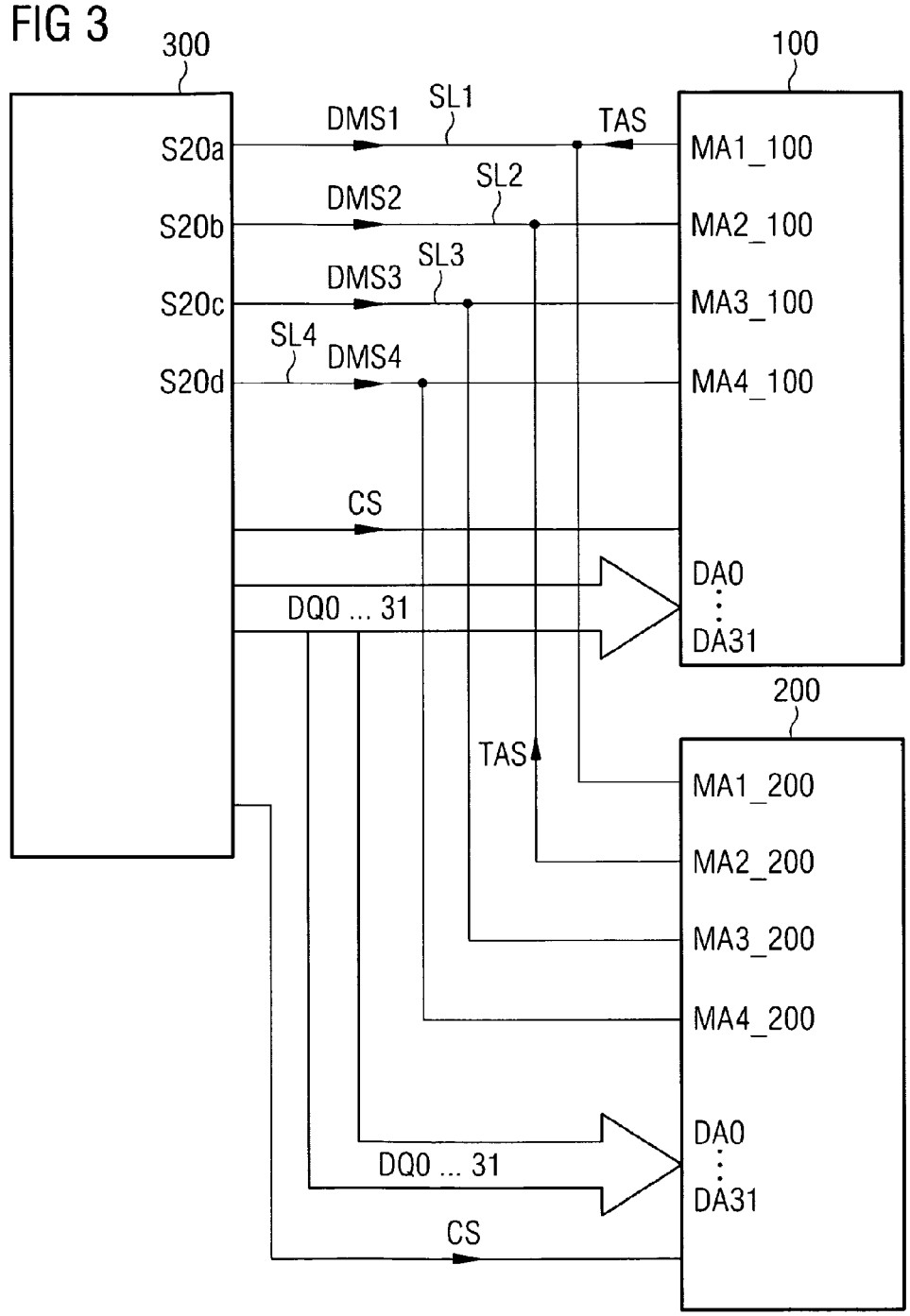
FIG. 3 shows a second embodiment of a memory module comprising integrated semiconductor memories in each of which a control signal is generated in the event of a threshold value of a chip temperature being exceeded.

FIG. 3 shows a further embodiment of a memory module in which a semiconductor memory 100 and a semiconductor memory 200 are connected to a control component 300. The control component 300 is connected via the control terminals S20a, S20b, S20c and S20d to conductor tracks SL1, SL2, SL3 and SL4 for transmitting the control signals DMS1, DMS2, DMS3 and DMS4 for masking data terminals DA0, . . . , DA31 of the semiconductor memory 100 and for masking data terminals DA0, . . . , DA31 of the semiconductor memory 200. For a memory access, the semiconductor memories can be selected by driving with a chip select signal CS.

If, by way of example, the semiconductor memory 100 is selected for a write access, the control component 300 drives the semiconductor memory 100 with the chip select signal CS. In this case, the control signals DMS1, DMS2, DMS3 and DMS4 are received at the control terminals MA1_100, MA2_100, MA3_100 and MA4_100 of the semiconductor memory 100. By contrast, the semiconductor memory 200 ignores the control signals, which are likewise also forwarded to the control terminals MA1_200, MA2_200, MA3_200 and MA4_200 of the semiconductor memory 200 on account of the parallel branching of the lines.

In the event of a read access to the semiconductor memory 100, the control component 300 likewise drives the semiconductor memory 100 with the chip select signal CS. In this case, the control component monitors the conductor track SL1 used for transmitting the control signal TAS from the semiconductor memory 100. In the event of a read access to the semiconductor memory 200, the semiconductor memory 200 is driven with the chip select signal CS by the control component. In this case, the control component 300 monitors the occurrence of a corresponding state of the control signal TAS on the conductor track SL2 at its control terminal S20b.

As a result, it is also possible in the case of the parallel interconnection of conductor tracks as illustrated in FIG. 3 to use the already existing conductor tracks for transmitting the masking signals DMS1, DMS2, DMS3 and DMS4 and also for transmitting the control signals TAS from different semiconductor memories. Each of the conductor tracks SL1, SL2, SL3 and SL4 is assigned to precisely one of the semiconductor memories present on a memory module, for the transmission of the control signal TAS. As a result of using already existing conductor tracks for transmitting the control signals TAS which are not used either during a read access or during a write access, it is possible to reduce the number of required conductor tracks and the number of terminal pins for transmitting the control signal TAS from the individual semiconductor memories to the control component.

Having described exemplary embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A memory device, comprising:
   a memory cell array comprising memory cells;
   a plurality of control terminals configured to receive control signals for performing read and write accesses to the memory cells of the memory cell array, wherein a subset of the control terminals does not receive control signals during the read access;
   a control circuit coupled to the control terminals, the control circuit controlling read and write accesses to the memory cells of the memory cell array in a manner dependent on the control signals; and
   a temperature sensor for recording a chip temperature of the memory device, the temperature sensor being coupled to the control circuit, wherein the control circuit is configured to generate an output temperature signal in a manner dependent on a temperature recorded by the temperature sensor and to supply the output temperature signal to one control terminal of the subset of control terminals during a the read access to the memory cells of the memory cell array.

2. The memory device according to claim 1, further comprising:
   a driver circuit coupled to the one control terminal and to the control circuit, wherein the driver circuit is driven by the control circuit to generate the output temperature signal at the one control terminal during the read access.

3. The memory device according to claim 1, further comprising:
   a plurality of data terminals for applying data, wherein:
   the control circuit comprises an evaluation circuit for evaluating one of the control signals present at the one control terminal;
   the control circuit is configured to write a datum present at one of the data terminals to one of the memory cells of the memory cell array in response to the write access to the memory device if the evaluation circuit determines that the one of the control signals is present with a first state at the one control terminal; and the control circuit is configured to ignore the datum present at the one of the data terminals for writing to the one of the memory cells of the memory cell array in response to the write access to the memory device if the evaluation circuit determines that the one of the control signals is present with a second state at the one control terminal.

4. The memory device according to claim 3, wherein the one control terminal comprises a terminal for masking the one of the data terminals.

5. The memory device according to claim 1, wherein:
the control circuit comprises a comparator circuit;
the comparator circuit is supplied a temperature value of the chip temperature recorded by the temperature sensor and a threshold value of the chip temperature; and
the control circuit is configured to generate the output temperature signal with a first state if the comparator circuit determines that the chip temperature recorded by the temperature sensor exceeds the threshold value of the chip temperature.

6. The memory device according to claim 1, further comprising:
a programming circuit for irreversibly programming the threshold value of the chip temperature, wherein the comparator circuit is connected to the programming circuit.

7. The memory device according to claim 6, wherein the programming circuit contains at least one fuse element.

8. The memory device according to claim 1, further comprising:
a further control terminal for applying a further control signal for configuring the memory device; and
a storage register for reversibly storing the threshold value of the chip temperature, the threshold value of the chip temperature being storable in the storage register in a manner dependent on a state of the further control signal;
wherein the comparator circuit is connected to the storage register for the supplying the threshold value of the chip temperature.

9. The memory device according to claim 8, wherein the storage register comprises a mode register of the memory device.

10. The memory device according to claim 1, further comprising:
a plurality of data terminals configured to receive data to be stored in the memory cell array during the write access to the memory cells of the memory cell array, wherein the subset of control terminals comprises masking control terminals configured to receiving masking control signals during the write access for masking selected ones of the data terminals.

11. A memory module, comprising:
a) a memory device, comprising:
a memory cell array comprising memory cells;
a plurality of control terminals configured to receive control signals for performing read and write accesses to the memory cells of the memory cell array, wherein a subset of the control terminals does not receive control signals during the read access;
a control circuit coupled to the control terminals, the control circuit controlling read and write accesses to the memory cells of the memory cell array in a manner dependent on the control signals; and a temperature sensor for recording a chip temperature of the memory device, the temperature sensor being coupled to the control circuit, wherein the control circuit is configured to generate an output temperature signal in a manner dependent on a temperature recorded by the temperature sensor and to supply the output temperature signal to one control terminal of the subset of control terminals during a the read access to the memory cells of the memory cell array; and b) a control unit configured to drive the memory device with the control signals for performing the read or write access to the memory cells of the memory device, wherein:
the control unit includes a bidirectional control terminal for generating one of the control signals and for receiving the output temperature signal;
the bidirectional control terminal is connected to the one control terminal of the memory device; and
the control unit is configured to control the read and write accesses, occurring during a unit of time, to the memory cells of the memory device in a manner dependent on the state, received at the bidirectional control terminal, of the output temperature signal that has been generated by the memory device.

12. The memory module according to claim 11, further comprising:
a further memory device, wherein:
the control unit comprises a further bidirectional control terminal for generating a further control signal and for receiving the output temperature signal;
the further bidirectional control terminal is connected to a control terminal of the further memory device;
the control unit is configured to control the read and write accesses, occurring during the unit of time, to memory cells of the further memory device in a manner dependent on the state of an output temperature signal that is received at the further bidirectional control terminal and has been generated by the further memory device;
the bidirectional control terminal is coupled to a further control terminal of the further memory device; and
the further bidirectional control terminal is coupled to a further control terminal of the subset of control terminals of the memory device.

13. A method for operating a memory device, comprising:
determining a chip temperature of a memory device that includes memory cells configured to store data and control terminals configured to receive control signals for performing read and write accesses to the memory cells, wherein a subset of the control terminals does not receive control signals during the read access;
comparing the determined chip temperature of the memory device with a threshold value of the chip temperature;
performing the read access to memory cells of the memory device;
generating a state of an output temperature signal in a manner dependent on the comparison of the determined chip temperature of the memory device with the threshold value of the chip temperature and supplying the output temperature signal at one control terminal of the subset of control terminals during the read access to the memory cells of the memory device;
detecting the state of the output temperature signal at the one control terminal by a control unit; and changing the read and write accesses, occurring during a unit of time, to the memory cells of the memory device in a manner dependent on the state of the output temperature signal.

14. The method according to claim 13 wherein the memory device further comprises a plurality of data terminals, the method further comprising:

driving the control terminals with the control signals for performing the write access, there being applied to the one control terminal a control signal for masking at least one of the data terminals for the write access;

applying data to the data terminals for writing the data to the memory cells; and subsequently performing the read access to the memory cells, the state of the output temperature signal being generated at the one control terminal.

15. A method for operating a memory device, comprising:

determining a chip temperature of a memory device that includes memory cells configured to store data and control terminals configured to receive control signals for performing read and write accesses to the memory cells, wherein a subset of the control terminals does not receive control signals during the write access;

comparing the determined chip temperature of the memory device with a threshold value of the chip temperature;

performing the write access to memory cells of the memory device;

generating a state of an output temperature signal in a manner dependent on the comparison of the determined chip temperature of the memory device with the threshold value of the chip temperature and supplying the output temperature signal at one control terminal of the subset of control terminals during the write access to the memory cells of the memory device;

detecting the state of the output temperature signal at the one control terminal by a control unit; and changing the read and write accesses, occurring during a unit of time, to the memory cells of the memory device in a manner dependent on the state of the output temperature signal.

16. A memory module, comprising:

a first memory device according to the memory device of claim 1;

a second memory device according to the memory device of claim 1; and a memory controller comprising: a first terminal coupled to the one control terminal of the first memory device; and a second terminal coupled to the one control terminal of the second memory device, wherein:

the first terminal of the memory controller is configured to supply a control signal to the one control terminal of the first memory device during write accesses to the memory cells of the first memory device and to receive the output temperature signal from the one control terminal of the first memory device; and the second terminal of the memory controller is configured to supply a control signal to the one control terminal of the second memory device during write accesses to the memory cells of the second memory device and to receive the output temperature signal from the one control terminal of the second memory device.

17. A memory module, comprising:

a first memory device according to the memory device of claim 1;

a second memory device according to the memory device of claim 1; and a memory controller comprising: a first terminal coupled to a first control terminal of the subset of control terminals of the first memory device and to a first control terminal of the subset of control terminals of the second memory device; and a second terminal coupled to a second control terminal of the subset of control terminals of the first memory device and to a second control terminal of the subset of control terminals of the second memory device, wherein:

the first and second terminals of the memory controller are configured to supply control signals to the first and second control terminals of the first and second memory devices during write accesses to the memory cells of the first and second memory devices;

the first terminal of the memory controller is configured to receive the output temperature signal from the first control terminal of the first memory device; and the second terminal of the memory controller is configured to receive the output temperature signal from the second control terminal of the second memory device.

* * * * *